(12) United States Patent
Lai et al.

(10) Patent No.: US 10,101,523 B1
(45) Date of Patent: Oct. 16, 2018

(54) LIGHT GUIDE HEAT DISSIPATION MODULE AND ELECTRONIC DEVICE

(71) Applicant: GIGA-BYTE TECHNOLOGY CO., LTD., New Taipei (TW)

(72) Inventors: Chih-Ming Lai, New Taipei (TW); Yung-Shun Kao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 15/911,194

(22) Filed: Mar. 5, 2018

(30) Foreign Application Priority Data

Jan. 30, 2018 (TW) .............................. 107103176 A

(51) Int. Cl.
*F21V 8/00* (2006.01)
*H05K 7/10* (2006.01)
(Continued)

(52) U.S. Cl.
CPC ........... *G02B 6/0085* (2013.01); *G02B 6/009* (2013.01); *G02B 6/0083* (2013.01); *G02B 6/0091* (2013.01); *H05K 1/0203* (2013.01); *H05K 1/028* (2013.01); *H05K 1/0274* (2013.01); *H05K 1/118* (2013.01); *H05K 1/144* (2013.01); *H05K 1/189* (2013.01); *H05K 7/10* (2013.01); *H05K 2201/042* (2013.01); *H05K 2201/10106* (2013.01); *H05K 2201/10189* (2013.01); *H05K 2201/10325* (2013.01); *H05K 2201/10409* (2013.01)

(58) Field of Classification Search
CPC .... G02B 6/0085; G02B 6/009; G02B 6/0026; G02B 6/0068
See application file for complete search history.

(56) References Cited

U.S. PATENT DOCUMENTS

| 2006/0262556 | A1* | 11/2006 | Zeng | G02B 6/0071 |
| | | | | 362/600 |
| 2016/0187567 | A1* | 6/2016 | Zhou | G02B 6/005 |
| | | | | 349/65 |
| 2018/0156968 | A1* | 6/2018 | Yoo | G02B 6/0085 |

FOREIGN PATENT DOCUMENTS

TW          I602049          10/2017

OTHER PUBLICATIONS

"Office Action of Taiwan Counterpart Application," dated Aug. 7, 2018, pp. 1-4.

* cited by examiner

*Primary Examiner* — Joseph L Williams
(74) *Attorney, Agent, or Firm* — JCIPRNET

(57) ABSTRACT

A light guide heat dissipation module includes a first heat dissipation member, a second heat dissipation member, a light guide member, and a light source assembly. The first heat dissipation member includes an opening. The second heat dissipation member is thermally coupled to the first heat dissipation member. The light guide member is disposed between the first heat dissipation member and the second heat dissipation member. The opening of the first heat dissipation member exposes a portion of the light guide member. The light guide member includes a light incident surface. The light source assembly includes a light source and a pad electrically connected to the light source. The light source is disposed beside the light incident surface of the light guide member. The pad is disposed on a bottom surface of the second heat dissipation member away from the first heat dissipation member. An electronic device including the light guide heat dissipation module is further provided.

10 Claims, 4 Drawing Sheets

(51) Int. Cl.
*H05K 1/02* (2006.01)
*H05K 1/18* (2006.01)
*H05K 1/11* (2006.01)
*H05K 1/14* (2006.01)

LIGHT GUIDE HEAT DISSIPATION MODULE AND ELECTRONIC DEVICE

CROSS-REFERENCE TO RELATED APPLICATION

This application claims the priority benefit of Taiwan application serial no. 107103176, filed on Jan. 30, 2018. The entirety of the above-mentioned patent application is hereby incorporated by reference herein and made a part of this specification.

BACKGROUND OF THE INVENTION

1. Field of the Invention

The invention relates to a heat dissipation module and an electronic device. More particularly, the invention relates to a light guide heat dissipation module and an electronic device.

2. Description of Related Art

Nowadays, in many of the electronic devices, connectors are disposed on the main boards for allowing expansion cards to be connected to the main boards, and that users are able to add expansion capabilities to the electronic devices. Heat is generated when an expansion card works, and a heat dissipation module is thereby disposed on the expansion card to prevent overheating. Nevertheless, in a dark environment, it is difficult for a user find the location of the expansion card, and that the expansion card may not be inserted easily.

SUMMARY OF THE INVENTION

The invention provides a light guide heat dissipation module providing both heat dissipation and light guide functions.

The invention further provides an electronic device having the light guide heat dissipation module.

A light guide heat dissipation module provided by an embodiment of the invention includes a first heat dissipation member, a second heat dissipation member, a light guide member, and a light source assembly. The first heat dissipation member includes an opening. The second heat dissipation member is thermally coupled to the first heat dissipation member. The light guide member is disposed between the first heat dissipation member and the second heat dissipation member. The opening of the first heat dissipation member exposes a portion of the light guide member. The light guide member includes a light incident surface. The light source assembly includes a light source and a pad electrically connected to the light source. The light source is disposed beside the light incident surface of the light guide member. The pad is disposed on a bottom surface of the second heat dissipation member away from the first heat dissipation member.

In an embodiment of the invention, the light source assembly further includes a flexible circuit board. The flexible circuit board includes a first portion, a second portion, and a third portion bendably connected in sequence. The light source is disposed at the first portion. The pad is disposed at the third portion. The second heat dissipation member includes a through slot. The first portion of the flexible circuit board is located beside the light incident surface. The second portion penetrates through the through slot. The third portion is fixed to the bottom surface of the second heat dissipation member.

In an embodiment of the invention, the light source is located in a space surrounded by the first heat dissipation member and the second heat dissipation member.

In an embodiment of the invention, the light guide member includes a protruding portion extending into the opening of the first heat dissipation member, and the protruding portion has a plurality of notches or a rough surface.

An electronic device provided by an embodiment of the invention is adapted for an expansion card and includes a main board and a light guide heat dissipation module. The main board includes a connector and an electric pin. The light guide heat dissipation module is detachably disposed on a position of the main board near the connector and is adapted to be thermally coupled to the expansion card inserted in the connector. The light guide heat dissipation module includes a first heat dissipation member, a second heat dissipation member, a light guide member, and a light source assembly. The first heat dissipation member includes an opening. The second heat dissipation member is thermally coupled to the first heat dissipation member. The light guide member is disposed between the first heat dissipation member and the second heat dissipation member. The opening of the first heat dissipation member exposes a portion of the light guide member. The light guide member includes a light incident surface. The light source assembly includes a light source and a pad electrically connected to the light source. The light source is disposed beside the light incident surface of the light guide member. The pad is disposed on a bottom surface of the second heat dissipation member away from the first heat dissipation member. When the light guide heat dissipation module is disposed on the main board, the pad of the light source assembly of the light guide heat dissipation module is conducted to the electric pin, and a light ray emitted by the light source is transmitted out of the opening of the first heat dissipation member through the light guide member.

In an embodiment of the invention, the electric pin is a pogo pin. When the light guide heat dissipation module is disposed on the main board, the pad of the light source assembly is in contact with and is pushed by the electric pin.

In an embodiment of the invention, the connector is a M.2 connector. The main board further includes a M.2 expansion card fixing base located at a side of the connector. The second heat dissipation member further includes a through hole. When the light guide heat dissipation module is disposed on the main board, a fixing member is adapted to penetrate through the through hole of the second heat dissipation member to be fixed to the M.2 expansion card fixing base of the main board. The electric pin is disposed beside the M.2 expansion card fixing base.

In an embodiment of the invention, the light source assembly further includes a flexible circuit board. The flexible circuit board includes a first portion, a second portion, and a third portion bendably connected in sequence. The light source is disposed at the first portion. The pad is disposed at the third portion. The second heat dissipation member includes a through slot. The first portion of the flexible circuit board is located beside the light incident surface. The second portion penetrates through the through slot. The third portion is fixed to the bottom surface of the second heat dissipation member.

In an embodiment of the invention, the light source is located in a space surrounded by the first heat dissipation member and the second heat dissipation member.

In an embodiment of the invention, the light guide member includes a protruding portion extending into the opening of the first heat dissipation member, and the protruding portion has a plurality of notches or a rough surface.

To sum up, in the light guide heat dissipation module of the electronic device provided by the embodiments of the invention, heat is dissipated through the first heat dissipation member and the second heat dissipation member. Further, in the light guide heat dissipation module, the pad of the light source assembly is disposed on the bottom surface of the second heat dissipation member away from the first heat dissipation member, and the light source is disposed beside the light incident surface of the light guide member located between the first heat dissipation member and the second heat dissipation member. When the light guide heat dissipation module is installed on the main board, the pad of the light source assembly of the light guide heat dissipation module is conducted to the electric pin of the main board, and a light ray is thereby emitted. The light ray is transmitted out of the opening of the first heat dissipation member through the light guide member.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
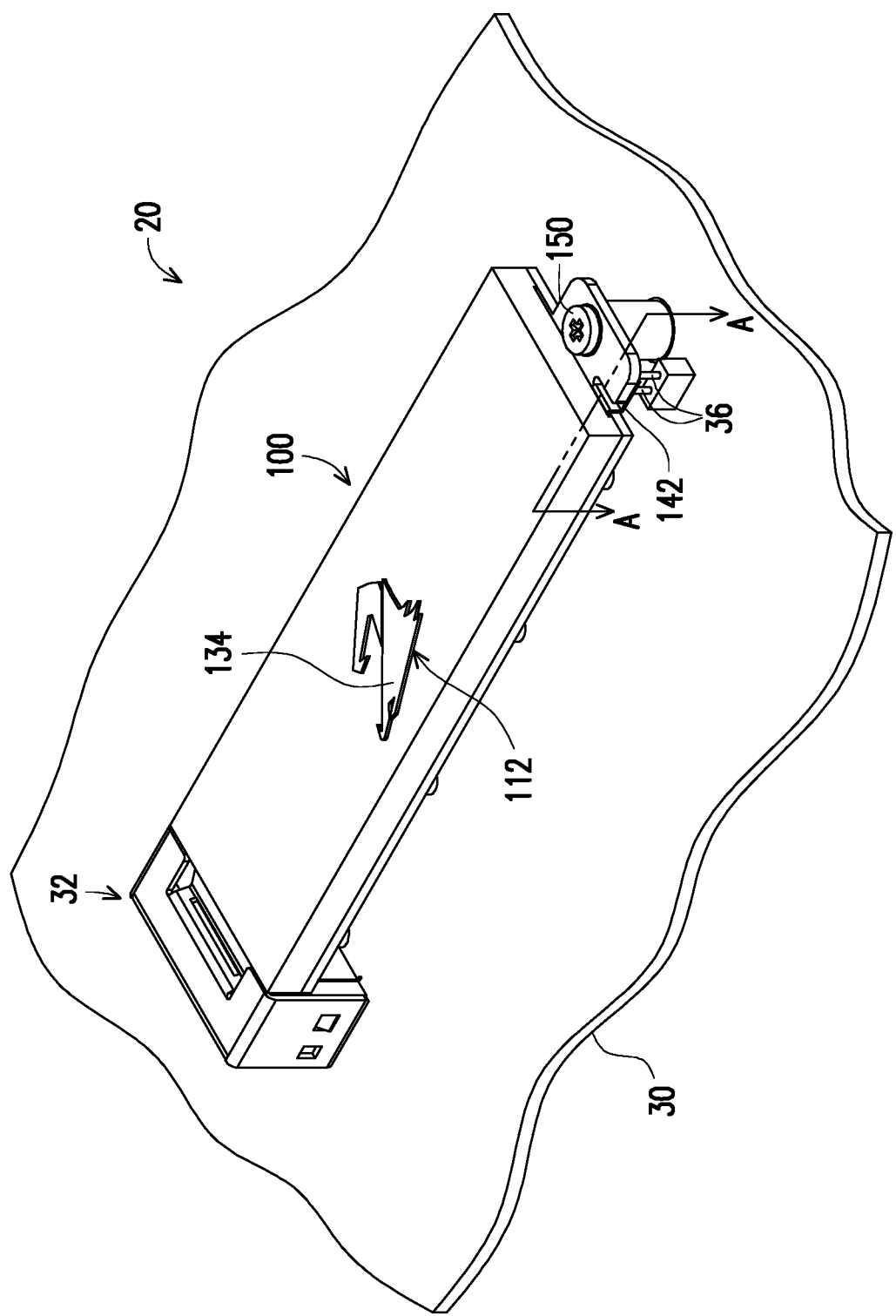
FIG. 1 is a schematic view of an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 2:
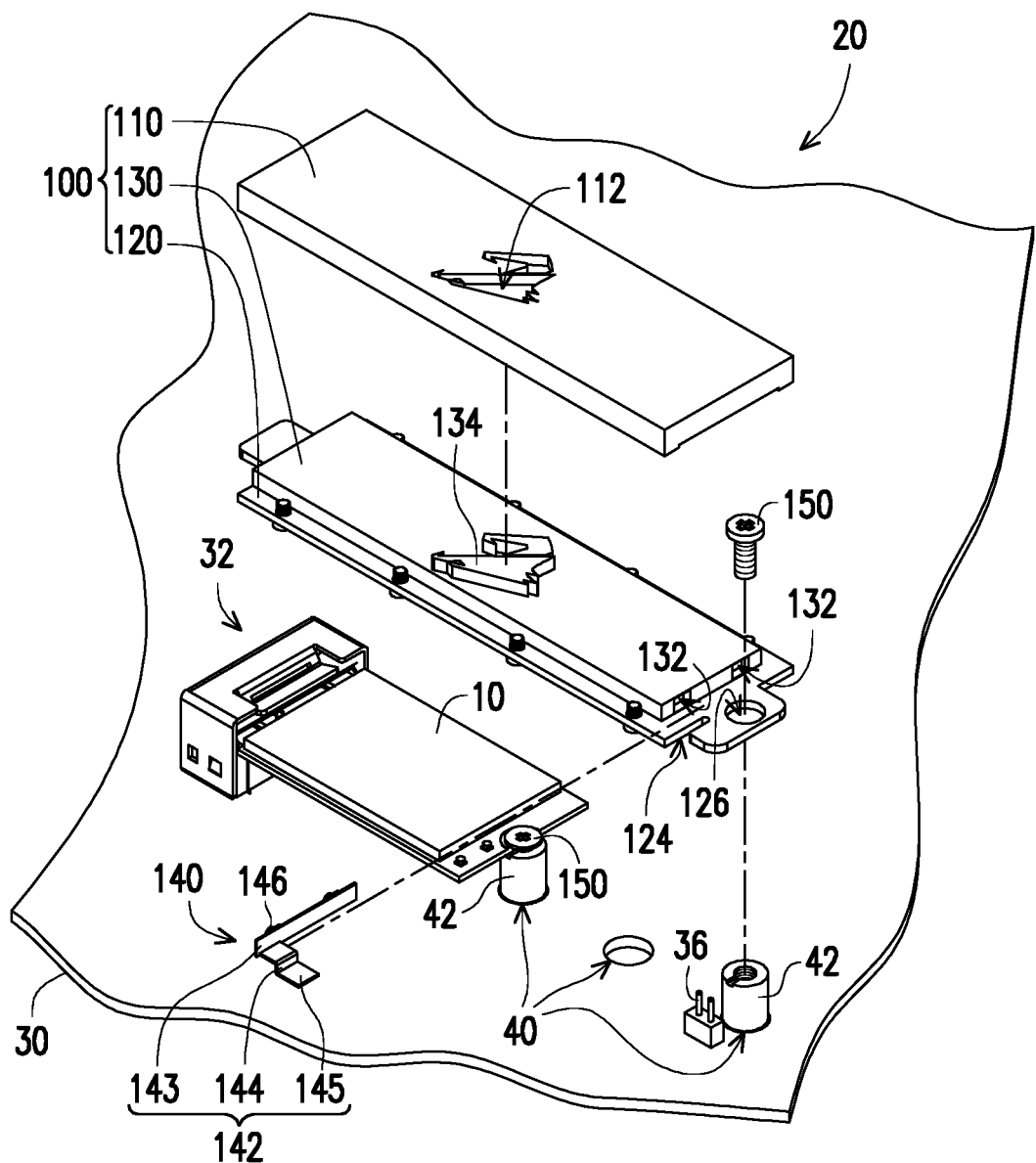
FIG. 2 is an exploded schematic view of a light guide heat dissipation module of the electronic device of FIG. 1 being moved upwards.
Figure 3:
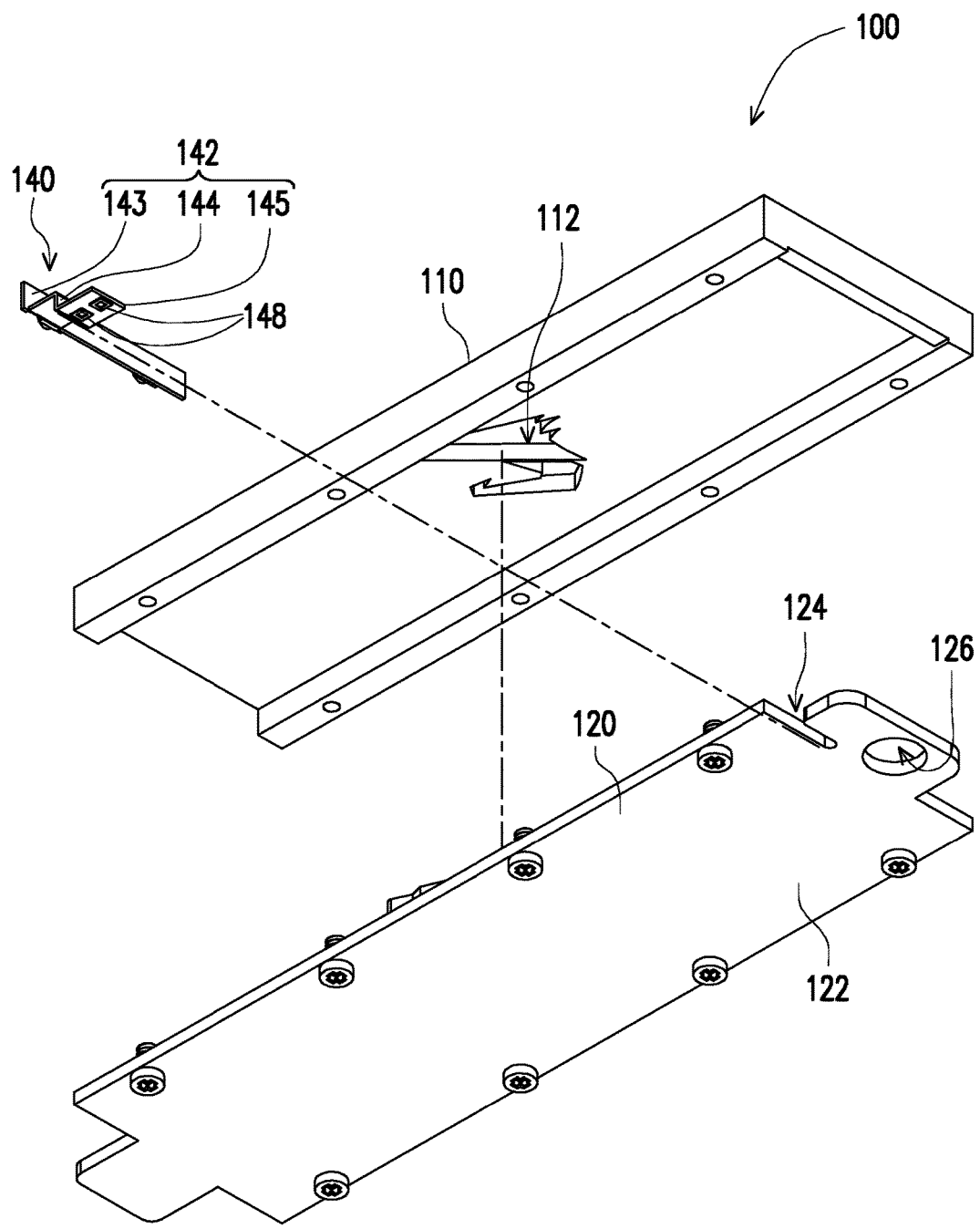
FIG. 3 is an exploded schematic view of the light guide heat dissipation module of FIG. 1 from another view angle.
Figure 4:
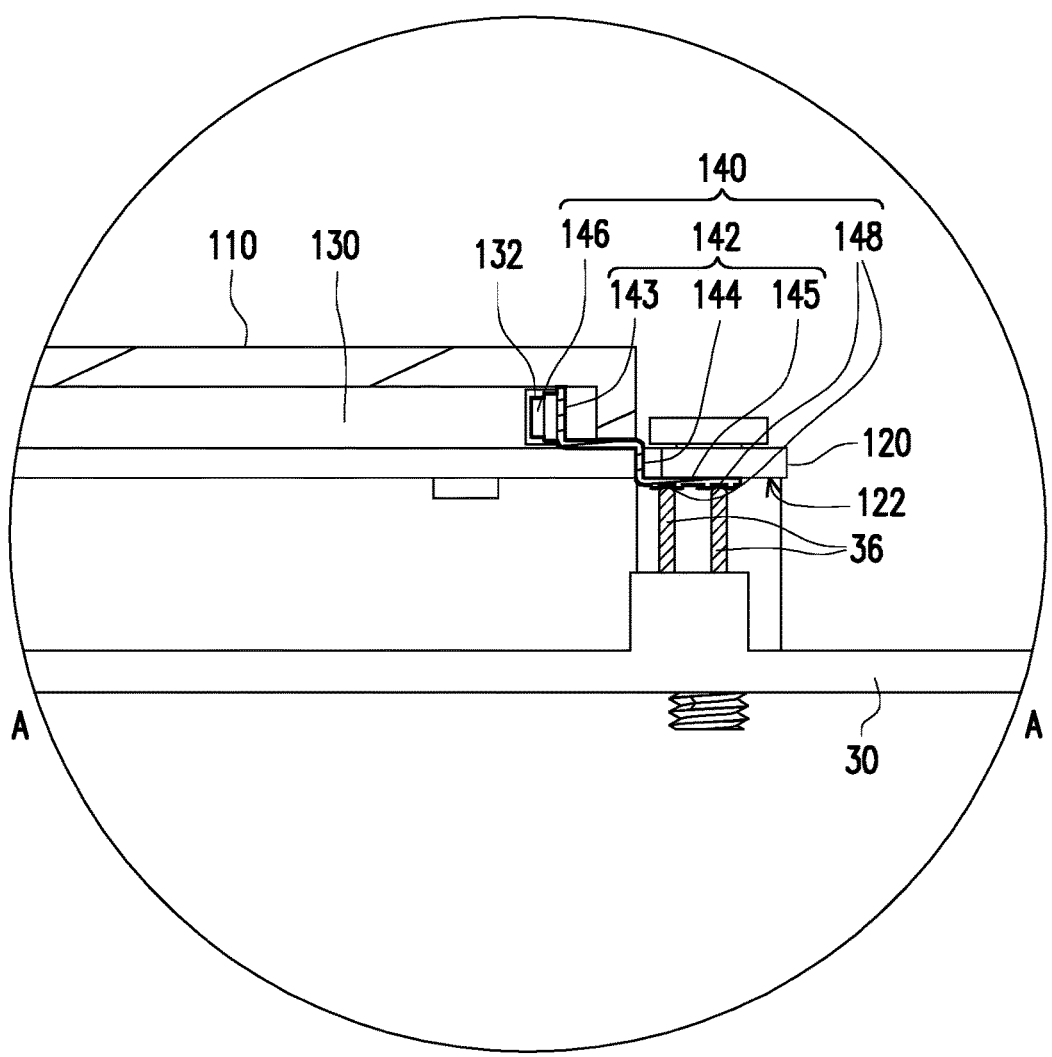
FIG. 4 is a cross-sectional schematic view of the electronic device of FIG. 1 taken along a line A-A.

FIG. 1 is a schematic view of an electronic device according to an embodiment of the invention. FIG. 2 is an exploded schematic view of a light guide heat dissipation module of the electronic device of FIG. 1 being moved upwards. FIG. 3 is an exploded schematic view of the light guide heat dissipation module of FIG. 1 from another view angle. FIG. 4 is a cross-sectional schematic view of the electronic device of FIG. 1 taken along a line A-A. With reference to FIG. 1 to FIG. 4, an electronic device 20 of this embodiment includes a main board 30 and a light guide heat dissipation module 100. The main board 30 includes a connector 32 and an electric pin 36 disposed beside the connector 32. The connector 32 is adapted for an expansion card 10 (shown in FIG. 2).

In this embodiment, a connector with an M.2 interface is used as an example for the connector 32, and the connector 32 is provided for the expansion card 10 with the M.2 interface to be inserted therein. The expansion card 10 connected to the connector 32 with the M.2 interface features a specific size. As such, fixing holes 40 corresponding to a length of the expansion card 10 are designed on the main board 30, so as to fix one end (this end is away from the other end inserted into the connector 32) of the expansion card 10 to the main board 30. As shown in FIG. 2, in the light guide heat dissipation module 100, M.2 expansion card fixing bases 42 may be disposed on the fixing holes 40, and that the expansion card 10 may be fixed conveniently as the fixing holes 40 are particularly retained for the connector 32 with the M.2 interface on the main board 30. In this embodiment, the electric pin 36 is located next to the M.2 expansion card fixing bases 42, but types of the connector 36 and the corresponding expansion card 10 and a location in which the electric pin 36 is disposed are not limited to the above.

As shown in FIG. 2, in this embodiment, the light guide heat dissipation module 100 may be detachably disposed on a position of the main board 30 near the connector 32 and is adapted to be thermally coupled to the expansion card 10 inserted in the connector 32. To be specific, the light guide heat dissipation module 100 includes a first heat dissipation member 110, a second heat dissipation member 120 thermally coupled to the first heat dissipation member 110, and a light guide member 130 disposed between the first heat dissipation member 110 and the second heat dissipation member 120 in this embodiment.

As shown in FIG. 2, in this embodiment, a size of the first heat dissipation member 110 is similar to a size of the second heat dissipation member 120. A size of the light guide member 130 in a width direction is slightly less than a size of the first heat dissipation member 110 and a size of the second heat dissipation member 120 in the width direction. Therefore, the first heat dissipation member 110 and the second heat dissipation member 120 may encapsulate the light guide member 130 in the width direction and are in contact with each other. The first heat dissipation member 110 and the second heat dissipation member 120 may be fixed with a screw in this embodiment, and the first heat dissipation member 110 and the second heat dissipation member 120 may also be fixed by adhering, engaging, riveting, and the like in other embodiments.

In this embodiment, a length size of the light guide heat dissipation module 100 may be disposed to be the length size corresponding to the expansion card 10 with the M.2 interface, as such, the second heat dissipation member 120 of the light guide heat dissipation module 100 may be conveniently fixed to the main board 30 through the M.2 expansion card fixing bases 42. In this embodiment, the second heat dissipation member 120 includes a through hole 126. When the light guide heat dissipation module 100 is disposed on the main board 30, a fixing member 150 (e.g., a screw) is adapted to penetrate through the through hole 126 of the second heat dissipation member 120 to be fixed to the M.2 expansion card fixing bases 42 of the main board 30. Therefore, no other fixing hole is required to be additionally disposed on the main board 30 for the light guide heat dissipation module 100 by a designer. Certainly, any other hole may be additionally disposed on the main board 30 for the light guide heat dissipation module 100 by the designer, and a position in which the light guide dissipation module 100 is fixed to the main board 30 is not limited to the above.

In addition, in this embodiment, if the length size of the light guide heat dissipation module 100 is a maximum length size corresponding to the expansion card 10 with the M.2 interface, the light guide heat dissipation module 100 may thus be applied to the expansion cards 10 with the M.2 interface of smaller sizes, and the fixing holes 40 on the main board 30 are shared together by the light guide heat dissipation module 100 and the expansion cards 10. For instance, as shown in FIG. 2, the length size of the expansion card 10 is less than the length size of the light guide heat dissipation module 100. As such, the expansion card 10 and the light guide heat dissipation module 100 may be fixed to the M.2 expansion card fixing bases 42 disposed on different fixing holes 40.

In this embodiment, when the light guide heat dissipation module 100 is installed on the main board 30, the second heat dissipation member 120 of the light guide heat dissipation module 100 is in contact with the expansion card 10. As such, heat generated by the expansion card 10 may be transmitted to the light guide heat dissipation module 100 to achieve a heat dissipation effect. Besides, the light guide heat dissipation module 100 also provides a light guide function in addition to dissipating heat for the expansion card 10.

To be more specific, the light guide member 130 is disposed between the first heat dissipation member 110 and the second heat dissipation member 120. The opening 112 of the first heat dissipation member 110 exposes a portion of the light guide member 130. The light guide member 130 includes a light incident surface 132. A light source assembly 140 is disposed on the second heat dissipation member 120 in this embodiment. The light source assembly 140 includes a light source 146 and a pad 148 electrically connected to the light source 146. The light source 146 is, for example, a light emitting diode, and a type of the light source 146 is not limited to the above. The light source 146 is disposed above the second heat dissipation member 120 and is located beside the light incident surface 132 of the light guide member 130. The pad 148 is disposed on a bottom surface 122 of the second heat dissipation member 120 away from the first heat dissipation member 110. Moreover, the bottom surface 122 of the second heat dissipation member 120 faces the main board 30 when the light guide heat dissipation module 100 is disposed on the main board 30.

When the light guide heat dissipation module 100 is not yet disposed on the main board 30, the light source 146 does not light up as no electricity is received in this embodiment. When the light guide heat dissipation module 100 is disposed on the main board 30, the pad 148 of the light source assembly 140 of the light guide heat dissipation module 100 is conducted to the electric pin 36. As such, the light source 146 may receive electricity from the electric pin 36 through the pad 148.

In this embodiment, the electric pin 36 is a pogo pin. When the light guide heat dissipation module 100 is disposed on the main board 30, the pad 148 of the light source assembly 140 is in contact with and is pushed by the pogo pin; nevertheless, a type to the electric pin 36 is not limited to the above. The electric pin 36 may be electrically connected to a power supply component (not shown) of the main board 30. The light source 146 may thereby receive a current from the main board 30 and may thus emit light. Further, the light emitted by the light source 146 may enter the light guide member 130 from the light incident surface 132. The light is then transmitted inside the light guide member 130 and is guided by the light guide member 130 to the opening 112 of the first heat dissipation member 110, as such, a slight illumination effect or a light indication effect is provided. In this embodiment, the electric pin 36 may be electrically connected to a controller (not shown) of the main board 30. The controller may control the light source 146 to emit light rays of different colors or turn to light or turn to dark at a specific time or control a frequency at which the light source 146 appears light or dark alternately via the electric pin 36 and the pad 148. It thus can be seen that a user may be notified of a specific signal through the colors of the light rays, whether the light source 146 appearing to be lighting up, or the light-dark frequency. Alternatively, the light source 146 may also bring a decoration effect.

It is worth noting that in this embodiment, the light source assembly 140 further includes a flexible circuit board 142. The flexible circuit board 142 includes a first portion 143, a second portion 144, and a third portion 145 bendably connected in sequence. The light source 146 is disposed at the first portion 143, and the pad 148 is disposed at the third portion 145. The second heat dissipation member 120 includes a through slot 124. The first portion 143 of the flexible circuit board 142 is located beside the light incident surface 132 of the light guide member 130, the third portion 145 of the flexible circuit board 142 is fixed to the bottom surface 122 of the second heat dissipation member 120, and the second portion 144 penetrates through the through slot 124.

In this embodiment, as the flexible circuit board 142 may be bent, the pad 148 of the light source assembly 140 may be disposed at the bottom surface 122 facing the second heat dissipation member 120 to face the electric pin 36 of the main board 30. Moreover, the light source 146 may be disposed above the second heat dissipation member 120 at a position near the light incident surface 132 of the light guide member 130. Certainly, a form of the light source assembly 140 is not limited to the above. In an embodiment that is not shown, the light source 146 may also be a straw-hat light emitting diode with a long pin. The pin may bendably penetrate the through slot 124 of the second heat dissipation member 120 to achieve the same effect as described above.

In addition, the light guide member 130 has a protruding portion 134 extending to the opening 112 of the first heat dissipation member 110 in this embodiment. A contour of the protruding portion 134 corresponds to a contour of the opening 112 of the first heat dissipation member 110. The protruding portion 134 may protrude from the light guide member 130, and in this way, the light rays emitted may appear to be more three-dimensional in this embodiment. In addition, a surface of the protruding portion 134 may include notches or may be a rough surface, such that the light rays may be guided out more intensely. Certainly, the protruding portion 134 may also be flushed with the light guide member 130, and that an appearance of the light guide member 130 remains intact in other embodiments. Alternatively, the protruding portion 134 may be lower than the light guide member 130. In other embodiments, the protruding portion 134 of the light guide member 130 may be omitted, and the light emitted by the light source 146 may still be guided by the light guide member 130 to the opening 112 of the first heat dissipation member 110.

Note that in this embodiment, a size of the light guide member 130 in a length direction is similar to a size of the first heat dissipation member 110 and a size of the second heat dissipation member 120 in the length direction. Nevertheless, the size of the light guide member 130 in the length direction may be reduced as well in other embodiments. For instance, the size of the light guide member 130 in the length direction may range from a position near the light source 146 to the opening 112 of the first heat dissipation member 110. In this way, the light guide member 130 may provide the same function of guiding the light rays emitted by the light source 146 to the opening 112 of the first heat dissipation member 110.

Besides, in this embodiment, the light source 146 is located in a space surrounded by the first heat dissipation member 110 and the second heat dissipation member 120 as shown in FIG. 4. Therefore, the light rays emitted by the light source 146 are transmitted out only through the opening 112 of the first heat dissipation member 110, and that light leakage is effectively prevented.

In view of the foregoing, in the light guide heat dissipation module of the electronic device provided by the embodiments of the invention, heat is dissipated through the first heat dissipation member and the second heat dissipation member. Further, in the light guide heat dissipation module, the pad of the light source assembly is disposed on the bottom surface of the second heat dissipation member away from the first heat dissipation member, and the light source is disposed beside the light incident surface of the light guide member located between the first heat dissipation member and the second heat dissipation member. When the light guide heat dissipation module is installed on the main board, the pad of the light source assembly of the light guide heat dissipation module is conducted to the electric pin of the main board and thus may emit light rays. The light rays may be transmitted out of the opening of the first heat dissipation member through the light guide member, and that a slight illumination effect or a light indication effect is provided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light guide heat dissipation module, comprising:
   a first heat dissipation member, comprising an opening;
   a second heat dissipation member, thermally coupled to the first heat dissipation member;
   a light guide member, disposed between the first heat dissipation member and the second heat dissipation member, the opening of the first heat dissipation member exposing a portion of the light guide member, the light guide member comprising a light incident surface; and
   a light source assembly, comprising a light source and a pad electrically connected to the light source, the light source being disposed beside the light incident surface of the light guide member, the pad being disposed on a bottom surface of the second heat dissipation member away from the first heat dissipation member.

2. The light guide heat dissipation module as claimed in claim 1, wherein the light source assembly further comprises a flexible circuit board, the flexible circuit board comprises a first portion, a second portion, and a third portion bendably connected in sequence, the light source is disposed at the first portion, the pad is disposed at the third portion, the second heat dissipation member comprises a through slot, the first portion of the flexible circuit board is located beside the light incident surface, the second portion penetrates through the through slot, and the third portion is fixed to the bottom surface of the second heat dissipation member.

3. The light guide heat dissipation module as claimed in claim 1, wherein the light source is located in a space surrounded by the first heat dissipation member and the second heat dissipation member.

4. The light guide heat dissipation module as claimed in claim 1, wherein the light guide member comprises a protruding portion extending into the opening of the first heat dissipation member, and the protruding portion has a plurality of notches or a rough surface.

5. An electronic device adapted for an expansion card, the electronic device comprising:
   a main board, comprising a connector and an electric pin; and
   a light guide heat dissipation module, detachably disposed on a position of the main board near the connector and adapted to be thermally coupled to the expansion card inserted in the connector, the light guide heat dissipation module comprising:
   a first heat dissipation member, comprising an opening;
   a second heat dissipation member, thermally coupled to the first heat dissipation member;
   a light guide member, disposed between the first heat dissipation member and the second heat dissipation member, the opening of the first heat dissipation member exposing a portion of the light guide member, the light guide member comprising a light incident surface; and
   a light source assembly, comprising a light source and a pad electrically connected to the light source, the light source being disposed beside the light incident surface of the light guide member, the pad being located on a bottom surface of the second heat dissipation member away from the first heat dissipation member, wherein the pad of the light source assembly of the light guide heat dissipation module is conducted to the electric pin when the light guide heat dissipation module is disposed on the main board, and a light ray emitted by the light source is transmitted out of the opening of the first heat dissipation member through the light guide member.

6. The electronic device as claimed in claim 5, wherein the electric pin is a pogo pin, and the pad of the light source assembly is in contact with and is pushed by the electric pin when the light guide heat dissipation module is disposed on the main board.

7. The electronic device as claimed in claim 5, wherein the connector is a M.2 connector, the main board further comprises a M.2 expansion card fixing base located at a side of the connector, the second heat dissipation member further comprises a through hole, a fixing member is adapted to penetrate through the through hole of the second heat dissipation member to be fixed to the M.2 expansion card fixing base of the main board when the light guide heat dissipation module is disposed on the main board, and the electric pin is disposed beside the M.2 expansion card fixing base.

8. The electronic device as claimed in claim 5, wherein the light source assembly further comprises a flexible circuit board, the flexible circuit board comprises a first portion, a second portion, and a third portion bendably connected in sequence, the light source is disposed at the first portion, the pad is disposed at the third portion, the second heat dissipation member comprises a through slot, the first portion of the flexible circuit board is located beside the light incident surface, the second portion penetrates through the through slot, and the third portion is fixed to the bottom surface of the second heat dissipation member.

9. The electronic device as claimed in claim 5, wherein the light source is located in a space surrounded by the first heat dissipation member and the second heat dissipation member.

10. The electronic device as claimed in claim 5, wherein the light guide member comprises a protruding portion extending into the opening of the first heat dissipation member, and the protruding portion has a plurality of notches or a rough surface.

\* \* \* \* \*